United States Patent
Ang

(10) Patent No.: US 7,410,838 B2
(45) Date of Patent: Aug. 12, 2008

(54) FABRICATION METHODS FOR MEMORY CELLS

(75) Inventor: Kern-Huat Ang, Johor (MY)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 70 days.

(21) Appl. No.: 10/834,012

(22) Filed: Apr. 29, 2004

(65) Prior Publication Data

US 2005/0242386 A1 Nov. 3, 2005

(51) Int. Cl.
*H01L 21/82* (2006.01)

(52) U.S. Cl. ............... 438/131; 257/530; 257/E21.35; 365/105

(58) Field of Classification Search ........... 257/530, 257/529, 910, E21.35, E21.351, E21.352, 257/656, E29.336, E21.053, E21.592; 438/132, 438/467, 237, 131, 600; 365/105, 175
See application file for complete search history.

(56) References Cited

U.S. PATENT DOCUMENTS

| | | | | |
|---|---|---|---|---|
| 5,567,644 A | * | 10/1996 | Rolfson et al. | 438/384 |
| 5,854,102 A | * | 12/1998 | Gonzalez et al. | 438/237 |
| 6,034,882 A | * | 3/2000 | Johnson et al. | 365/103 |
| 6,229,157 B1 | * | 5/2001 | Sandhu | 257/75 |
| 6,369,431 B1 | * | 4/2002 | Gonzalez et al. | 257/390 |
| 6,490,218 B1 | | 12/2002 | Vyvoda et al. | 365/225.7 |
| 6,525,953 B1 | | 2/2003 | Johnson | 365/63 |
| 6,559,516 B1 | * | 5/2003 | Van Brocklin et al. | 257/530 |
| 6,677,220 B2 | * | 1/2004 | Van Brocklin et al. | 438/467 |
| 6,946,719 B2 | * | 9/2005 | Petti et al. | 257/530 |
| 6,952,043 B2 | * | 10/2005 | Vyvoda et al. | 257/530 |
| 7,247,876 B2 | * | 7/2007 | Lowrey | 257/19 |
| 2003/0030148 A1 | * | 2/2003 | Herner et al. | 257/770 |
| 2003/0053332 A1 | * | 3/2003 | Kleveland et al. | 365/185.03 |
| 2003/0064572 A1 | * | 4/2003 | Johnson | 438/527 |
| 2005/0026334 A1 | * | 2/2005 | Knall | 438/128 |
| 2005/0063220 A1 | * | 3/2005 | Johnson | 365/154 |

* cited by examiner

*Primary Examiner*—Lex Malsawma
*Assistant Examiner*—William F Kraig
(74) *Attorney, Agent, or Firm*—Birch, Stewart, Kolasch & Birch, LLP

(57) ABSTRACT

A memory cell and a method of fabricating the same. A first conductive layer on a substrate is provided and a first type doped semiconductor layer is then formed on the first conductive layer. The first type doped semiconductor layer and the first conductive layer are patterned into a first line. A dielectric layer is formed on the substrate with an opening exposing the first line. A column comprising a second diode component, a buffer layer, and an anti-fuse layer is formed in the opening. A second line is formed connecting the column on the dielectric layer running generally perpendicularly to the first line.

8 Claims, 23 Drawing Sheets

FABRICATION METHODS FOR MEMORY CELLS

BACKGROUND OF THE INVENTION

1. Field of the Invention

The present invention relates to a semiconductor technology, more particularly to a one-time programmable anti-fuse memory cell.

2. Description of the Related Art

Memory arrays that use an anti-fuse layer to store digital data are well known to those skilled in the art. Vyvoda, in U.S. Pat. No. 6,490,218, the entirety of which is hereby incorporated by reference, describes a digital memory method and system for storing multiple bit digital data. The memory arrays include three-dimensional memory cell arrays. Each memory cell includes a diode and an anti-fuse layer. The anti-fuse layer acts initially as an insulator, blocking forward current through the memory cell. The memory cell can be programmed by sending a write voltage/current through the memory cell to disrupt the anti-fuse layer, thereby lowering the resistance of the memory cell. The contents of the memory cell can be read as logic 1 if the memory cell resistance is in a lower range, indicating that the anti-fuse layer has been disrupted, and as logic 0 if the resistance is at a higher initial level.

Johnson, in U.S. Pat. No. 6,525,953 and in publication No. 2003/0064572, the entirety of which is hereby incorporated by reference, describe an exemplary vertically-stacked, field-programmable, nonvolatile memory and a method of fabricating the same.

FIG. 1 shows a conventional one-time programmable memory cell of the background art with an anti-fuse layer. The memory cell has two explicit terminals, a word line 10 and a bit line 11. Between these terminals, the memory cell contains a pillar 12 of layers comprising a p-type doped silicon layer 13, an n-type doped silicon layer 14, and an anti-fuse layer 16. The anti-fuse layer 16 acts initially as an insulator, and in this state no diode is formed. When the anti-fuse layer 16 is disrupted, at least part of the first diode component consisting of the p-type doped silicon layer 13 contacts the second diode component consisting of the n-type doped silicon layer 14, thereby forming a PN diode 12 serving as a switch.

Once formed, the PN diode 12 is a device with a strongly asymmetric current-versus-voltage characteristic, i.e., it conducts current more readily in one direction than in the other. The purpose of the PN diode 12 is to ensure that current flow through the memory cell is substantially unidirectional. This unidirectional behavior enables the memory decoders to establish a unique circuit path to each individual memory cell, allowing it to be individually accessed for reads and for writes regardless of the state of all other cells.

One of the shortcomings of the related art is that the fabrication of the pillar PN diode 12 is difficult. Neither the word line 10, nor the bit line 11, nor the pillar 12 of layers is formed in the planar substrate. Typically, the pillar PN diode 12 is formed by layer deposition and subsequent patterning to define the pillar 12. The reduction in memory size accompanying an increased number of devices, results in a more narrow process window for patterning the deposited layers by etching. Additionally, the pillar PN diode 12 is highly susceptible to lifting and collapsing.

SUMMARY OF THE INVENTION

The present invention overcomes the shortcomings associated with the background art and achieves other advantages not realized by the background.

An object of the present invention is to provide a memory cell and a method of fabricating the same to prevent PN diode lifting in the pillar.

An object of the present invention is to provide a memory cell and a method of fabricating the same to enlarge the process window to improve yield.

An additional object of the present invention is to provide a memory cell and a simple method of fabricating the same.

An additional object of the present invention is to provide an easier way of masking opening patterns instead of small island patterns.

One or more of these and other objects are accomplished by a method for fabricating a memory cell, comprising forming a first conductive line and a first diode component on a substrate sequentially, forming a dielectric layer on the substrate with an opening exposing the first diode component on the first conductive line, forming a stack filling the opening, comprising a second diode component, a buffer layer and an anti-fuse layer, and forming a second conductive line on the dielectric layer, connecting the stack and generally perpendicularly to the first conductive line.

One or more of these and other objects are further accomplished by a method for fabricating a memory cell, comprising forming a first conductive line in a first dielectric layer on a substrate, exposing a surface of the first conductive line, forming a first column comprising a first diode component on the exposed first conductive layer, forming a second dielectric layer covering the first dielectric layer and the first conductive line and the first diode component with an opening exposing the first column, forming a second column filling the opening, comprising a second diode component, a buffer layer and an anti-fuse layer, and forming a second conductive line on the second dielectric layer, connecting the second column and generally perpendicularly to the first conductive line.

One or more of these and other objects are further accomplished by a memory cell comprising a first line on a substrate, comprising a first conductive line and a first diode component on the first conductive line, a stack on the first line, comprising an anti-fuse layer, a second diode component and a buffer layer on the second diode component, and a second conductive line on the stack, generally perpendicularly to the first line.

One or more of these and other objects are further accomplished by a memory cell comprising a first conductive line on a substrate, a stack on the first conductive line, comprising an anti-fuse layer, a first diode component, a second diode component on the first diode component and a buffer layer on the second diode component, and a second conductive line on the stack, generally perpendicularly to the first conductive line.

One or more of these and other objects are further accomplished by a memory cell comprising a first line on a substrate, comprising a first conductive line, an anti-fuse line and a first diode component on the first conductive line, a stack on the first line, comprising a second diode component and a buffer layer on the second diode component, and a second conductive line on the stack, generally perpendicularly to the first line.

One aspect of the present invention is the formation of the dielectric layer. After forming a hole by etching the dielectric layer, the PN diode is formed therein. The process window of etching the dielectric layer for the hole is thus enlarged compared to the prior art.

The first type doped semiconductor is p-type doped silicon and the second type doped semiconductor is n-type doped silicon. Alternatively, it should be noted that the first type doped semiconductor can also be n-type doped silicon and the second type doped semiconductor can also be p-type doped silicon.

According to the present invention, the PN diode comprises the p-type doped silicon layer, the lightly n-type doped silicon layer, the n-type doped silicon layer, and the anti-fuse layer. Particularly, the anti-fuse layer cannot only be formed at the terminal of the pillar PN diode above the n-type doped silicon layer but also be interposed between the p-type doped silicon layer and the lightly n-type doped silicon layer. Thus, in one embodiment of the present invention, the pillar PN diode is formed by the subsequent stacking of the p-type doped silicon layer, the lightly n-type doped silicon layer, the n-type doped silicon layer, and the anti-fuse layer. In another embodiment of the present invention, the pillar PN diode is formed by the subsequent stacking of the p-type doped silicon layer, the anti-fuse layer, the lightly n-type doped silicon layer, and the n-type doped silicon layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

Figure 1:
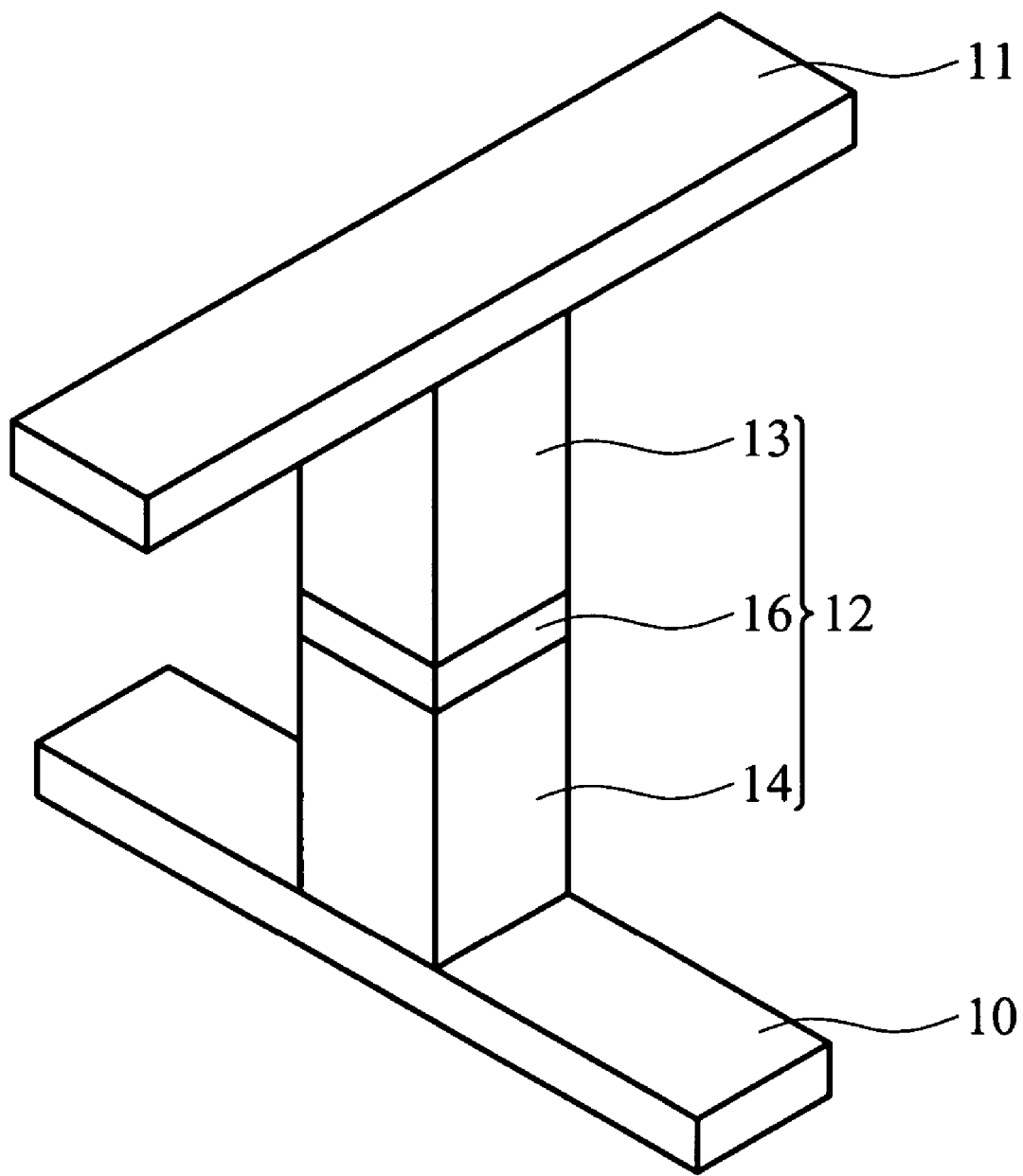
FIG. 1 is a cross section of a one-time programmable memory cell of the related art.

The present invention will hereinafter be described with reference to the accompany drawings.

In compared with the prior art, the key feature of the present invention is formation of the columnar PN diode in the etched hole of the dielectric layer, thereby enlarging the process window for etching the dielectric layer. In one aspect of the present invention, the formation of the dielectric layer is a single step. After forming a hole by etching the dielectric layer, the PN diode is formed therein.

The columnar PN diode 220 comprises a first diode component consisting of the $p^+$-type doped semiconductor layer 222, a second diode component consisting of the lightly $n^-$-type doped semiconductor layer 224 and the $n^+$-type doped semiconductor layer 226, and the anti-fuse layer 228. Thus, in one embodiment of the present invention, the PN diode is formed by the subsequent stacking of the $p^+$-type doped semiconductor layer, the lightly n-type doped semiconductor layer, the $n^+$-type doped semiconductor layer, and the anti-fuse layer. In another embodiment of the present invention, the columnar PN diode is formed by the subsequent stacking of the $p^+$-type doped semiconductor layer, the anti-fuse layer, the lightly $n^-$-type doped semiconductor layer, and the $n^+$-type doped semiconductor layer. In further another preferred embodiment, the PN diode is formed by the subsequent stacking of the anti-fuse layer, the $p^+$-type doped semiconductor layer, the lightly $n^-$-type doped semiconductor layer, and the $n^+$-type doped semiconductor layer.

Hereinafter, six embodiments are illustrated as in the following. The semiconductor is exemplified but not limited to silicon; other semiconductor materials are also applicable in the invention.

First Embodiment

FIGS. 2A through 2F are cross-sections of a one-time programmable memory cell according to a first embodiment of the present invention.

Figure 2A:
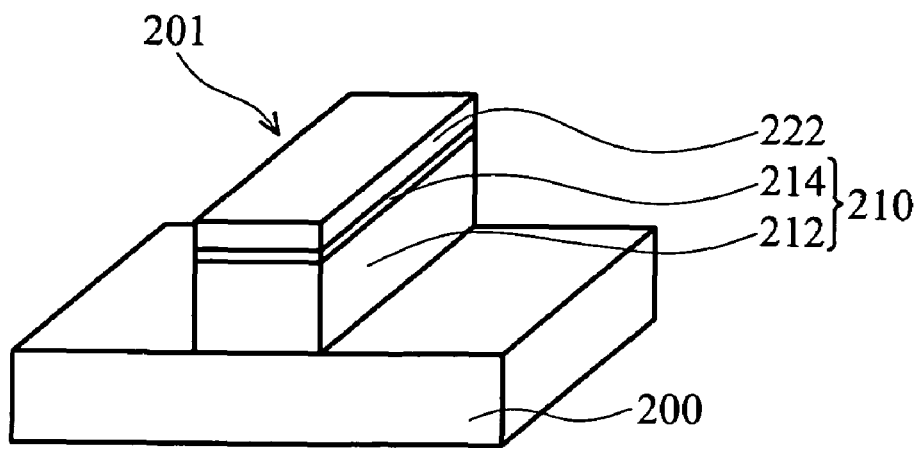
FIGS. 2A through 2F are cross-sections of a one-time programmable memory cell according to a first embodiment of the present invention.

Referring to FIG. 2A, a first line 201 is formed on a single crystal silicon substrate 200. Alternatively, the substrate 200 may be a silicon-on-sapphire (SOS) substrate, a dielectrically isolated substrate, or a silicon-on-insulator (SOI) substrate. The first line 201 comprises a first conductive line 210 and a first type doped silicon layer 222. The first conductive line 210 can be tungsten 212 or a barrier layer 214 on tungsten 212 as word line or bit line. The barrier layer 214 includes TiN, Ta, and TaN.

Next, a first type, e.g., $p^+$-type, doped silicon layer 222 is formed on the first conductive line 210 preferably by selective deposition or patterning accompanying deposition. The tungsten layer 212, the barrier layer 214, and the first type doped silicon layer 222 are preferably formed on the substrate 200 and lithographically etched into the first line 201.

The $p^+$-type doped silicon layer 222 is formed on the barrier layer 214 preferably by deposition, such as chemical vapor deposition (CVD). In this embodiment, the formation of the $p^+$-type doped silicon layer 222 is accomplished by depositing a Si layer with $p^+$-type dopants. The $p^+$-type dopants comprise boron (B), Gallium (Ga), or indium (In). Preferably, the thickness of the $p^+$-type doped silicon layer 222 is about 200~500 Å.

Figure 2B:
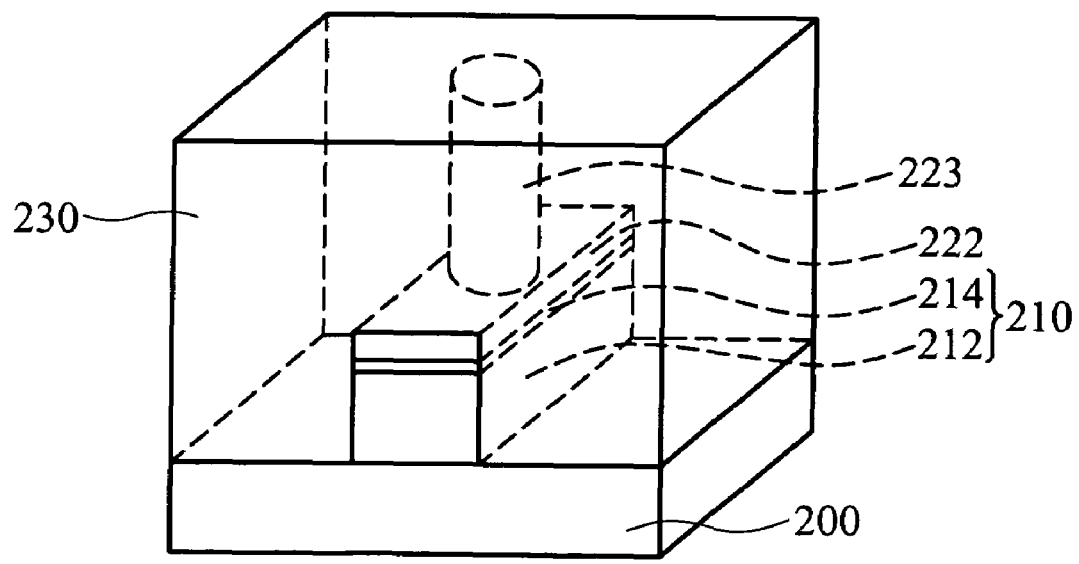

Referring to FIG. 2B, a dielectric layer 230 is formed on the substrate covering the first line 201. The material of the dielectric layer 230 can comprise $SiO_2$, borosilicate glass (BSG), borophosphate silicate glass (BPSG), fluorosilicate glass (FSG), or tetra-ethyl-ortho-silicate (TEOS) formed by deposition as is well known in the art.

The dielectric layer 230 is subsequently subjected to etching to form an opening 223 in the dielectric layer 230 to expose the surface of the $p^+$-type doped silicon layer 222.

Figure 2C:
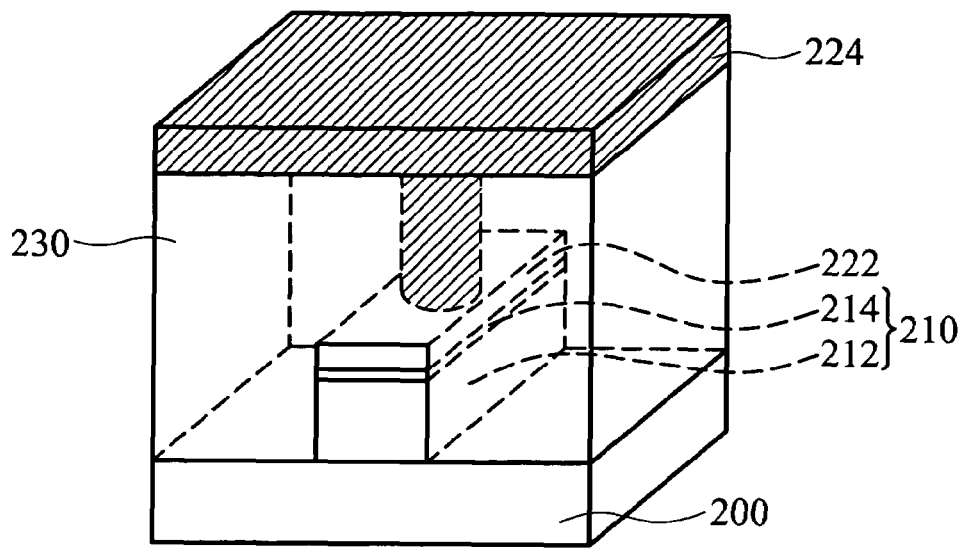

Referring to FIG. 2C, a silicon layer 224 is deposited on the dielectric layer 230 filling the hole 223. The silicon layer 224 can be intrinsic or undoped silicon. Alternatively, the silicon layer 224 can be lightly second type doped, e.g., n-type doped, silicon. The n⁻-type dopants comprise phosphorous (P) or arsenic (As).

The silicon layer 224 is then planarized with, for instance, chemical mechanical polishing (CMP) until the dielectric layer 230 is exposed.

Figure 2D:
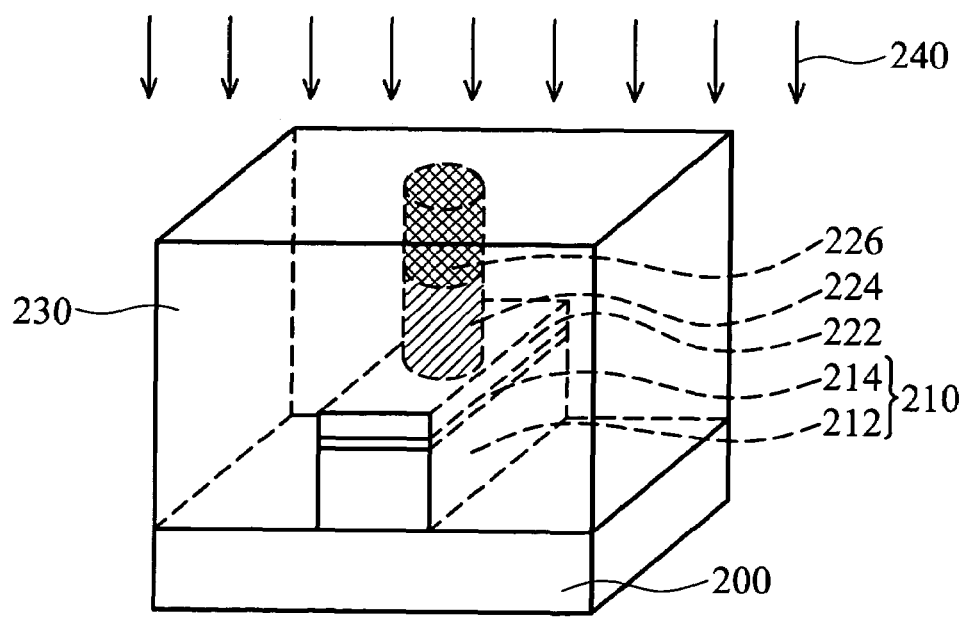

Referring to FIG. 2D, after CMP, the silicon layer 224 is subjected to an n⁺-type ion implantation 240. Thus, an n⁺-type doped silicon layer 226 is formed in the upper portion of the silicon layer 224. Dopant dosage of the n⁺-type doped silicon layer 226 exceeds that of the lightly n⁻-type doped silicon layer 224.

Figure 2E:
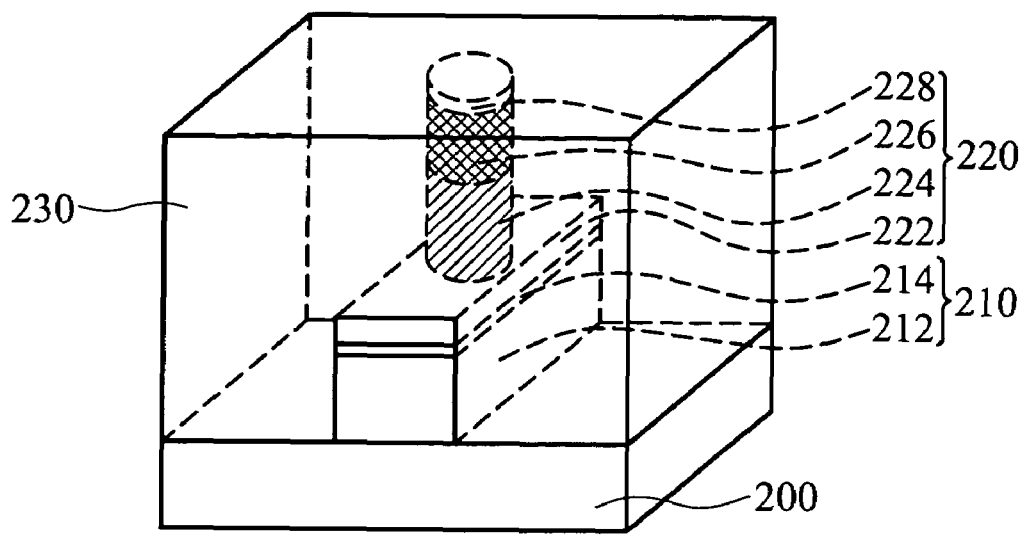

Referring to FIG. 2E, an insulating layer 228 comprising $SiO_2$, silicon nitride, or silicon oxynitride is subsequently formed on the n-type doped silicon layer 226 as an anti-fuse layer. Growth of the anti-fused layer 228 can be achieved by a number of methods, including rapid thermal oxidation (RTO), rapid thermal nitridation, PVD and CVD.

The PN diode comprises a first diode component consisting of the p⁺-type doped silicon layer 222, a second diode component consisting of the lightly n⁻-type doped silicon layer 224, a buffer layer consisting of the n⁺-type doped silicon layer 226, and the anti-fuse layer 228. In one preferred embodiment, the anti-fuse layer 228 is disposed on the n⁺-type doped silicon layer 226.

Preferably, the thickness of the lightly n⁻-type doped silicon layer 224 is about 2000~4000 Å, the thickness of the n⁺-type doped silicon layer 226 is about 200~1000 Å and the thickness of the anti-fuse layer 228 is about 10~30 Å.

Figure 2F:
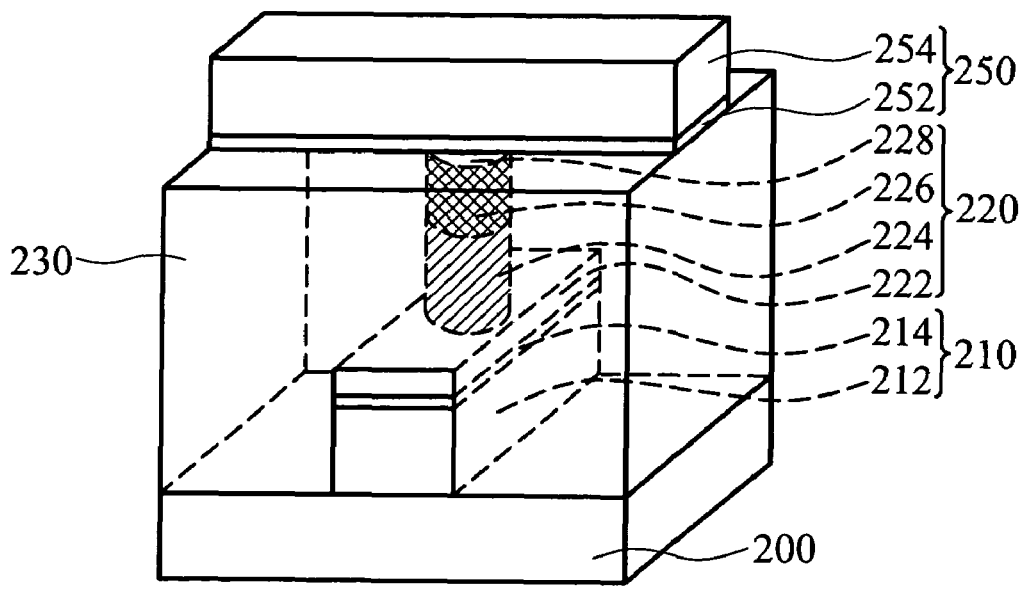

Referring to FIG. 2F, a second conductive line 250 comprising tungsten 254 or a barrier layer 252 beneath tungsten 254 is formed on dielectric layer 230 connecting the PN diode.

The first conductive line 210 serving as a word line and the second conductive line 250 serving as a bit line are connected to a pillar PN diode serving as a switch. Alternatively, the first conductive line 210 serving as a bit line and the second conductive line 250 serving as a word line are connected to a pillar PN diode serving as a switch. After programming by disrupting the anti-fuse layer 228, the switch is turned on allowing current to flow between the word line and bit line by passing through the PN diode.

Second Embodiment

FIGS. 3A through 3E are cross-sections of a one-time programmable memory cell according to a second embodiment of the present invention.

Figure 3A:
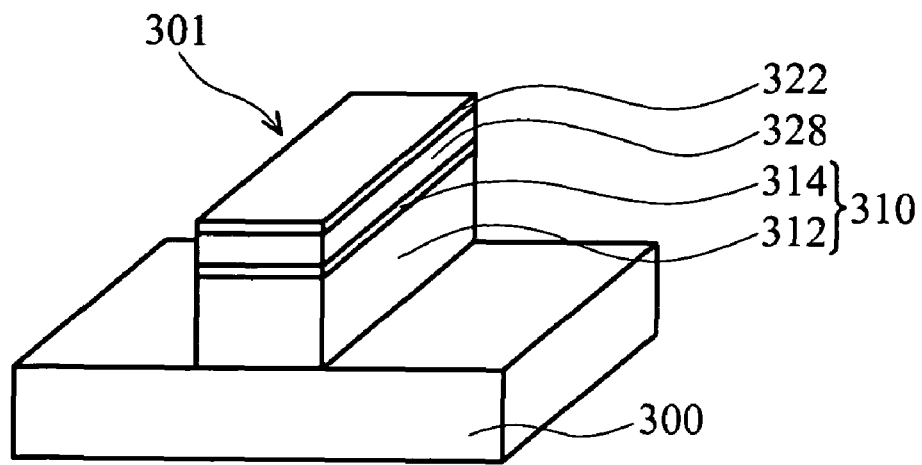
FIGS. 3A through 3E are cross-sections of a one-time programmable memory cell according to a second embodiment of the present invention.

Referring to FIG. 3A, a first line 301 is formed on a single crystal silicon substrate 300. The first line 301 comprises a first conductive line 310, an insulating layer 328, and a first type doped silicon layer 322. The first conductive line 310 can be tungsten 312 or a barrier layer 314 on tungsten 312 as word line or bit line. The barrier layer 314 includes TiN, Ta, and TaN.

Next, the insulating layer 328 and a first type doped silicon layer 322 are formed on the first conductive line 310 preferably by selective deposition or patterning accompanying deposition. The insulating layer 328 comprising $SiO_2$, silicon nitride, or silicon oxynitride is served as an anti-fuse layer. Growth of the anti-fused layer 328 can be achieved by rapid thermal oxidation (RTO), rapid thermal nitridation, PVD or CVD.

The conductive layer 312, the barrier layer 314, the insulating layer 328 and the first type doped silicon layer 322 are preferably formed on the substrate 300 and lithographically etched into the first line 301.

The first type, e.g., p⁺-type, doped silicon layer 322 is formed on the anti-fuse layer 328 preferably by deposition, such as chemical vapor deposition (CVD). In the preferred embodiment, the formation of the p⁺-type doped silicon layer 322 is accomplished by depositing a Si layer with p⁺-type dopants. The p⁺-type dopants comprise boron (B), Gallium (Ga), or indium (In).

Figure 3B:
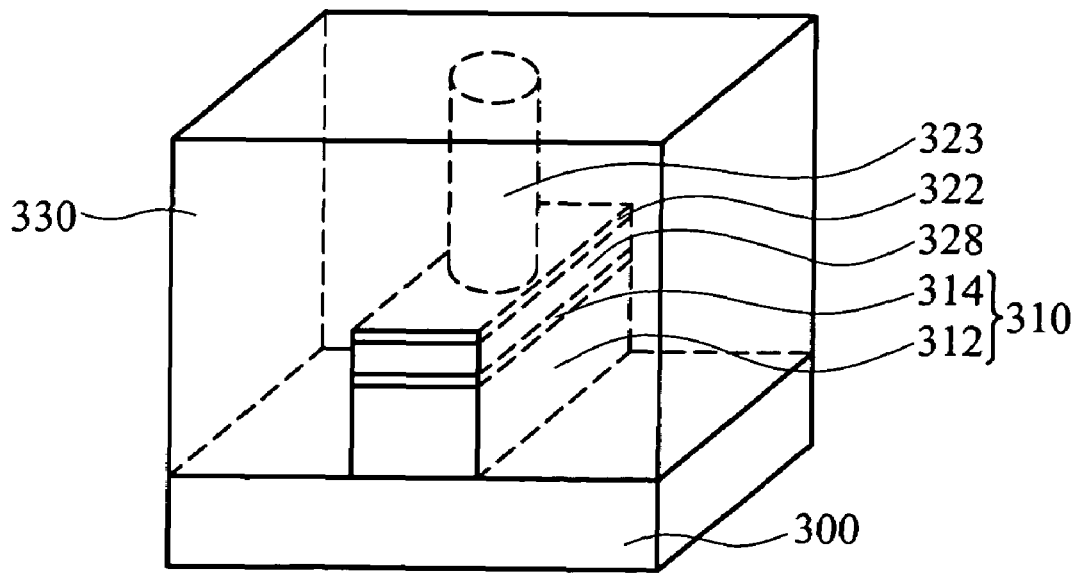

Referring to FIG. 3B, a dielectric layer 330 is formed on the substrate covering the first line 301. The material of the dielectric layer 330 can comprise $SiO_2$, borosilicate glass (BSG), borophosphate silicate glass (BPSG), fluorosilicate glass (FSG), or tetra-ethyl-ortho-silicate (TEOS) formed by deposition as is well known in the art.

The dielectric layer 330 is subsequently subjected to etching to form a hole 323 in the dielectric layer 330 to expose the surface of the p⁺-type doped silicon layer 322.

Figure 3C:
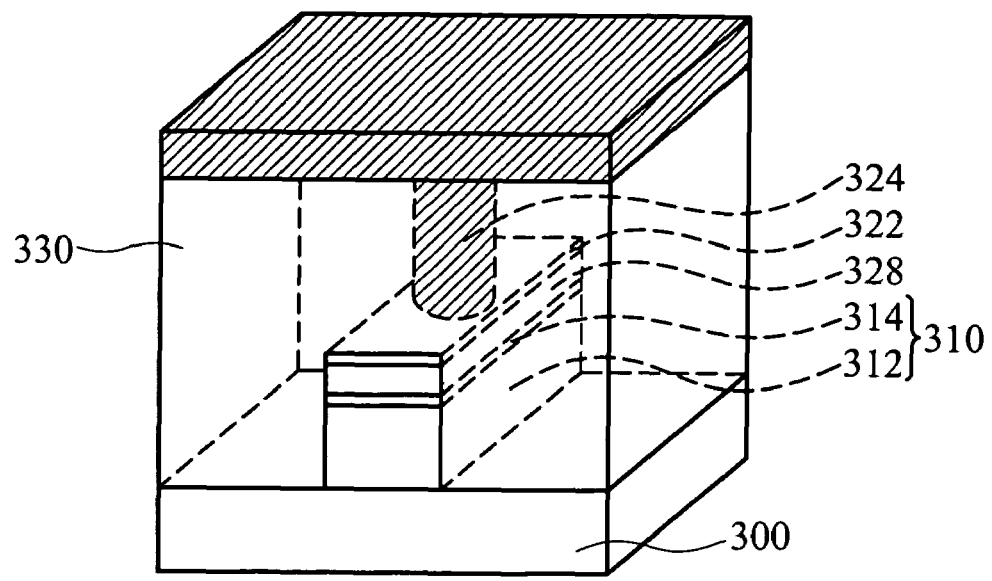

Referring to FIG. 3C, a silicon layer 324 is deposited on the dielectric layer 330 filling the hole 323. The silicon layer 324 can be intrinsic or undoped silicon. Alternatively, the silicon layer 324 can be lightly second type doped, e.g., n⁻-type doped, silicon. The n⁻-type dopants comprise phosphorous (P) or arsenic (As).

The silicon layer 324 is then planarized with, for instance, chemical mechanical polishing (CMP) until the dielectric layer 330 is exposed.

Figure 3D:
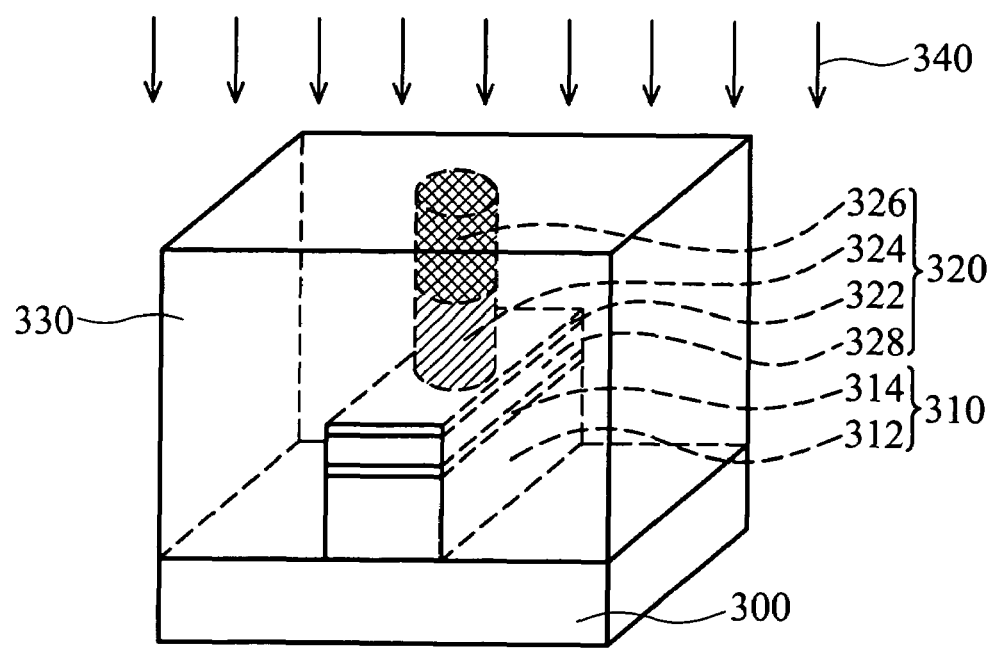

Referring to FIG. 3D, after CMP, the silicon layer 324 is subjected to an n⁺-type ion implantation 340. Thus, an n⁺-type doped silicon layer 326 is formed in the upper portion of the silicon layer 324. Dopant dosage of the n⁺-type doped silicon layer 326 exceeds that of the lightly n-type doped silicon layer 324.

The PN diode comprises the anti-fuse layer 328, a first diode component consisting of the p-type doped silicon layer 322, a second diode component consisting of the lightly n⁻-type doped silicon layer 324, and the n⁺-type doped silicon layer 326. In this embodiment, the anti-fuse layer 328 is disposed underneath the p⁺-type doped silicon layer 322.

Figure 3E:
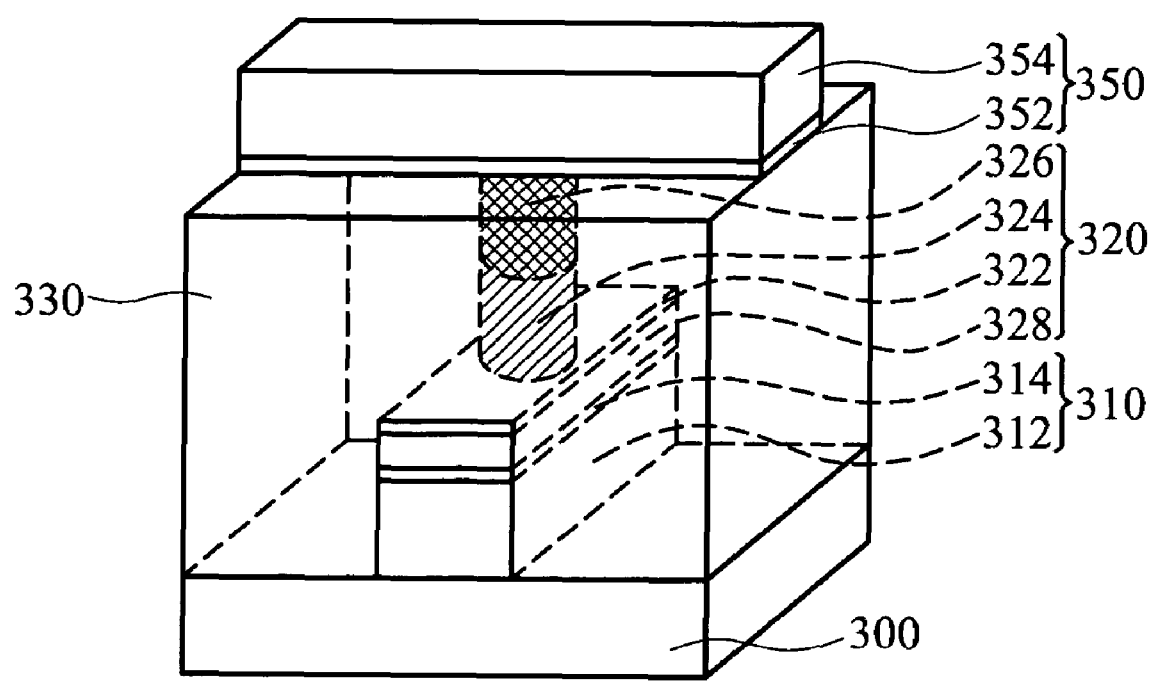

Referring to FIG. 3E, a second conductive line 350 comprising tungsten 354 or a barrier layer 352 beneath tungsten 354 is formed on dielectric layer 330 connecting the PN diode.

Third Embodiment

FIGS. 4A through 4E are cross-sections of a one-time programmable memory cell according to a third embodiment of the present invention.

Figure 4A:
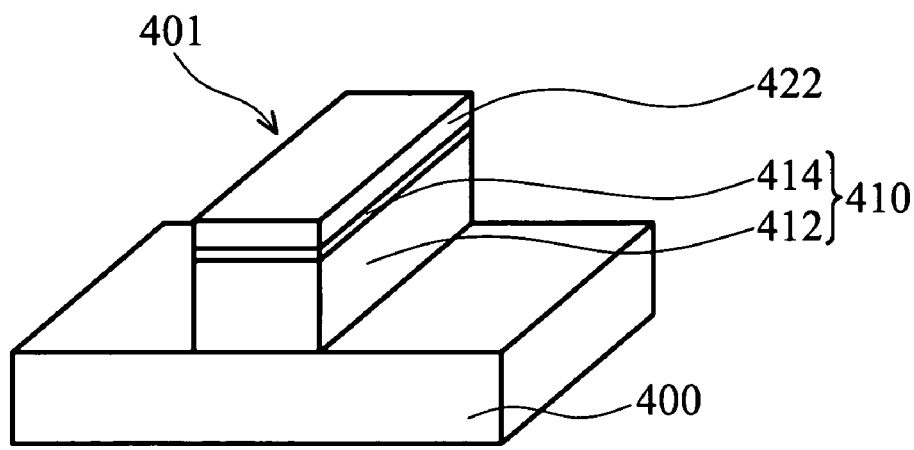
FIGS. 4A through 4E are cross-sections of a one-time programmable memory cell according to a third embodiment of the present invention.

Referring to FIG. 4A, a first line 401 is formed on a single crystal silicon substrate 400. The first line 401 comprises a first conductive line 410 and a first type doped silicon layer 422. The first conductive line 410 can be tungsten or a barrier layer 414 on tungsten 412 as word line or bit line. The barrier layer 414 includes TiN, Ta, and TaN.

Next, a first type, e.g., p⁺-type, doped silicon layer 422 is formed on the first conductive line 410 preferably by selective deposition or patterning accompanying deposition. The tungsten layer 412, the barrier layer 414, and the first type doped silicon layer 422 are preferably formed on the substrate 400 and lithographically etched into the first line 401.

The p⁺-type doped silicon layer 422 is formed on the barrier layer 414 preferably by deposition, such as chemical vapor deposition (CVD). In the preferred embodiment, the formation of the p⁺-type doped silicon layer 422 is accomplished by depositing a Si layer with p⁺-type dopants. The p⁺-type dopants comprise boron (B), Gallium (Ga), or indium (In).

Figure 4B:
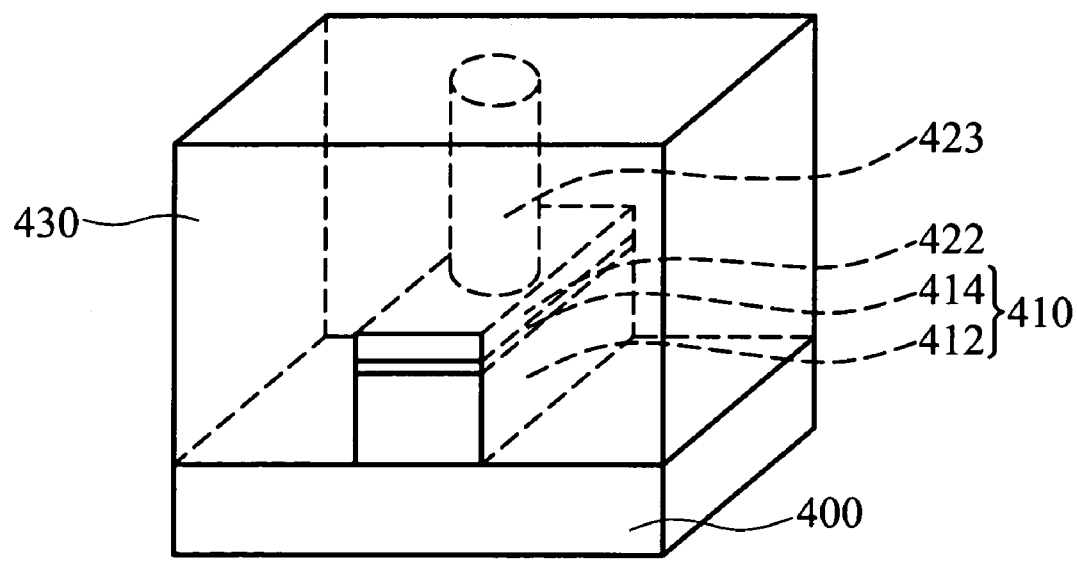

Referring to FIG. 4B, a dielectric layer 430 is formed on the substrate covering the first line 401. The material of the dielectric layer 430 can comprise $SiO_2$, borosilicate glass (BSG), borophosphate silicate glass (BPSG), fluorosilicate glass (FSG), or tetra-ethyl-ortho-silicate (TEOS) formed by deposition as is well known in the art.

The dielectric layer 430 is subsequently subjected to etching to form a hole 423 in the dielectric layer 430 to expose the surface of the $p^+$-type doped silicon layer 422.

Figure 4C:
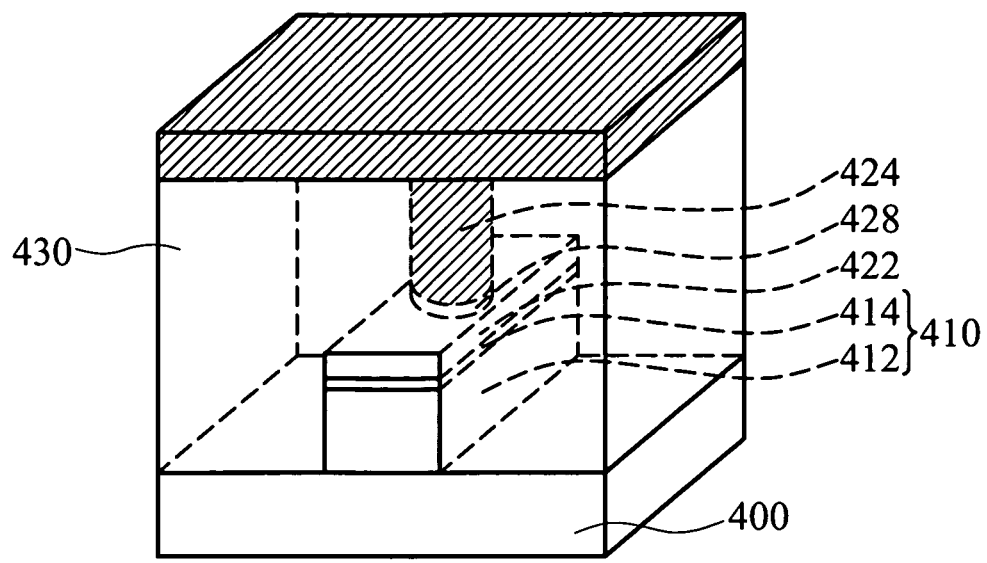

Referring to FIG. 4C, an insulating layer 428 comprising $SiO_2$, silicon nitride, or silicon oxynitride is subsequently formed in the hole 423 and on the p-type doped silicon layer 422 as an anti-fuse layer. Growth of the anti-fused layer 428 can be achieved by a number of methods, including rapid thermal oxidation (RTO), rapid thermal nitridation, PVD and CVD. A silicon layer 424 is deposited on the dielectric layer 430 filling the hole 423. The silicon layer 424 can be intrinsic or undoped silicon. Alternatively, the silicon layer 424 can be lightly second type doped, e.g., $n^-$-type doped, silicon. The $n^-$-type dopants comprise phosphorous (P) or arsenic (As).

The silicon layer 424 is then planarized with, for instance, chemical mechanical polishing (CMP) until the dielectric layer 430 is exposed.

Figure 4D:
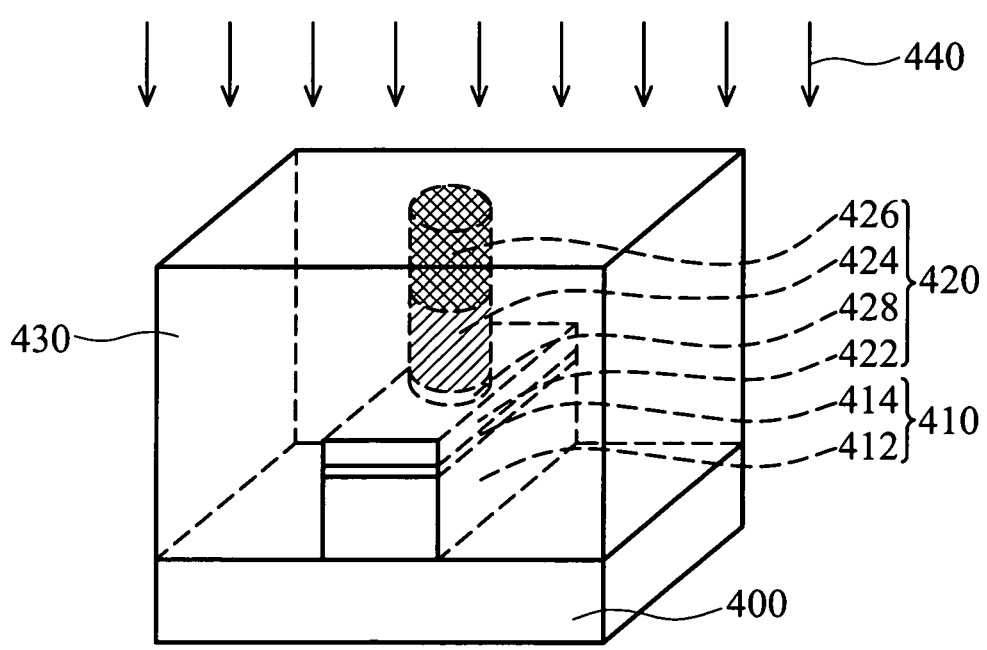

Referring to FIG. 4D, after CMP, the silicon layer 424 is subjected to an $n^+$-type ion implantation 440. Thus, an $n^+$-type doped silicon layer 426 is formed in the upper portion of the silicon layer 424. Dopant dosage of the $n^+$-type doped silicon layer 426 exceeds that of the lightly $n^-$-type doped silicon layer 424.

The PN diode comprises a first diode component consisting of the p-type doped silicon layer 422, the anti-fuse layer 428, a second diode component consisting of the lightly $n^-$-type doped silicon layer 424, and the $n^+$-type doped silicon layer 426. In this embodiment, the anti-fuse layer 428 is interposed between the first diode component 422 and the second diode component 424.

Figure 4E:
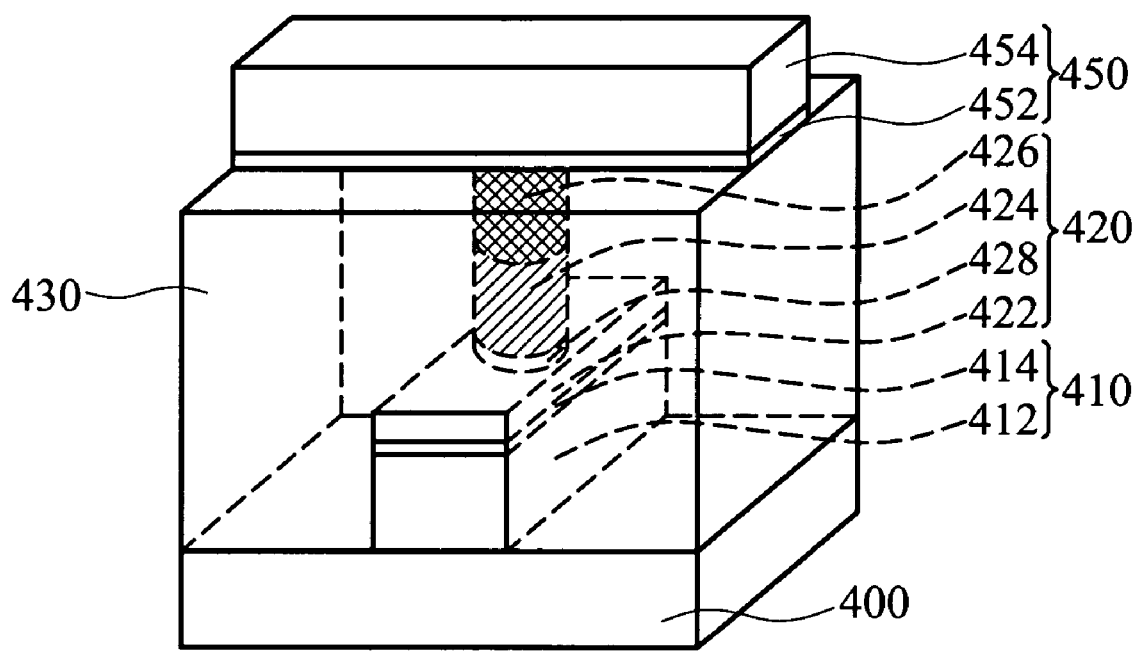

Referring to FIG. 4E, a second conductive line 450 comprising tungsten 454 or a barrier layer 452 beneath tungsten 454 is formed on dielectric layer 430 connecting the PN diode.

In another aspect of the present invention, the dielectric layer is formed in different steps. After forming a hole by etching a second dielectric layer, the PN diode is formed therein.

Fourth Embodiment

FIGS. 5A through 5I are cross-sections of a one-time programmable memory cell according to a fourth embodiment of the present invention.

Figure 5A:
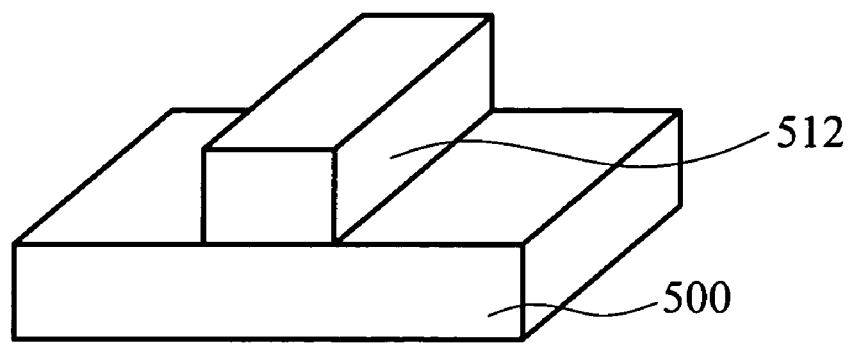
FIGS. 5A through 5I are cross-sections of a one-time programmable memory cell according to a fourth embodiment of the present invention.

Referring to FIG. 5A, first conductive line 512 comprising tungsten is provided on a single crystal silicon substrate 500 to serve as word line or bit line. Alternatively, the substrate 500 may be a silicon-on-sapphire (SOS) substrate, a dielectrically isolated substrate, or a silicon-on-insulator (SOI) substrate.

Figure 5B:
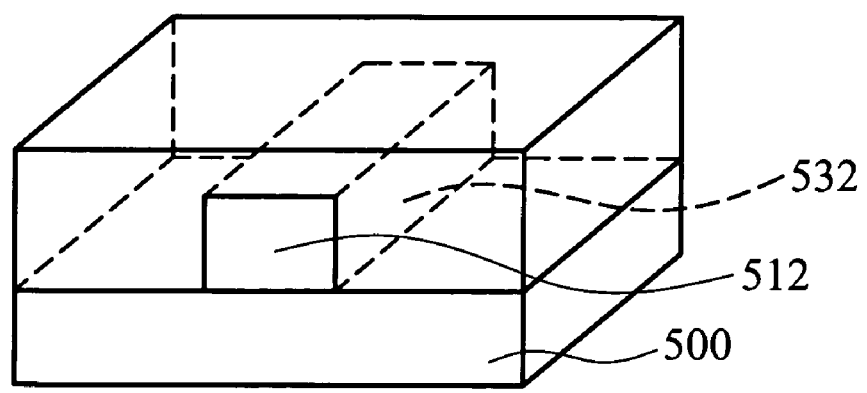
Figure 5C:
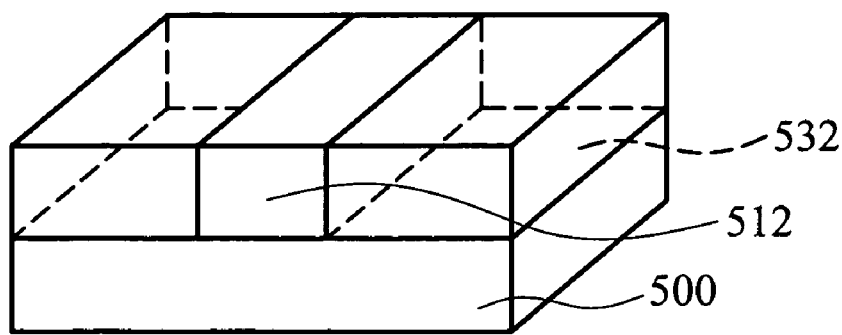

Referring to FIG. 5B, a first dielectric layer 532 is formed on the substrate 500 covering the first conductive line 512. The first dielectric layer 532 is planarized with, for instance, chemical mechanical polishing (CMP) to expose the first conductive line 512 and to provide a flat surface on which the array can be fabricated as shown in FIG. 5C. The material of the first dielectric layer 532 can comprise $SiO_2$, borosilicate glass (BSG), borophosphate silicate glass (BPSG), fluorosilicate glass (FSG), or tetra-ethyl-ortho-silicate (TEOS) formed by deposition as is well known in the art.

Figure 5D:
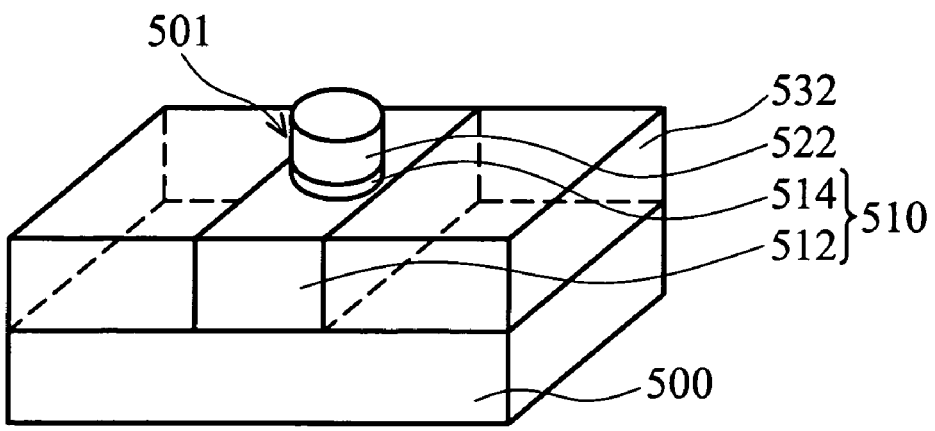

Referring to FIG. 5D, a stack of a barrier layer 514 and a first type doped silicon layer 522 are formed on the first conductive line 512. The barrier layer 514 comprising TiN, Ta, and TaN and the first type, e.g., $p^+$-type, doped silicon layer 522 are formed on the first conductive line 512 preferably by selective deposition or patterning accompanying deposition. The barrier layer 514 and the first type doped silicon layer 522 are preferably formed on the flat surface of conductive line 512 and planarized dielectric 532 and lithographically etched into an island 501.

A $p^+$-type doped silicon layer 522 is formed preferably by deposition, such as chemical vapor deposition (CVD). In the preferred embodiment, the formation of the $p^+$-type doped silicon layer 522 is accomplished by depositing a Si layer with $p^+$-type dopants. The $p^+$-type dopants comprise boron (B), Gallium (Ga) and indium (In). Preferably, the thickness of the $p^+$-type doped silicon layer 522 is about 200~500 Å.

Figure 5E:
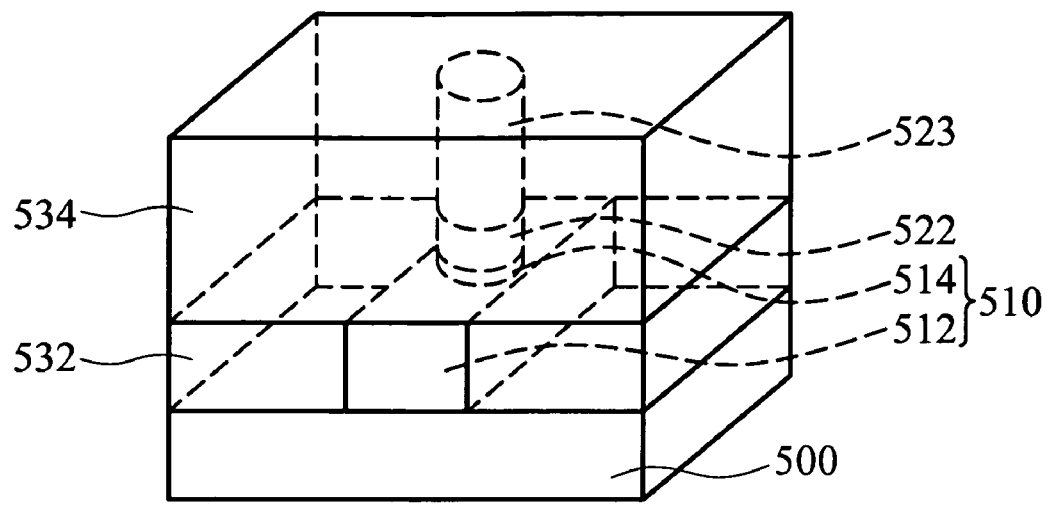

Referring to FIG. 5E, a second dielectric layer 534 is formed overlying the first dielectric 532 covering the stack of the $p^+$-type doped silicon layer 522 and the barrier layer 514. The material of the second dielectric layer 534 can comprise $SiO_2$, borosilicate glass (BSG), borophosphate silicate glass (BPSG), fluorosilicate glass (FSG), or tetra-ethyl-ortho-silicate (TEOS) formed by deposition as is well known in the art.

The second dielectric layer 534 is subsequently subjected to etching to form a hole 523 in the second dielectric layer 534 to expose the surface of the $p^+$-type doped silicon layer 522.

Figure 5F:
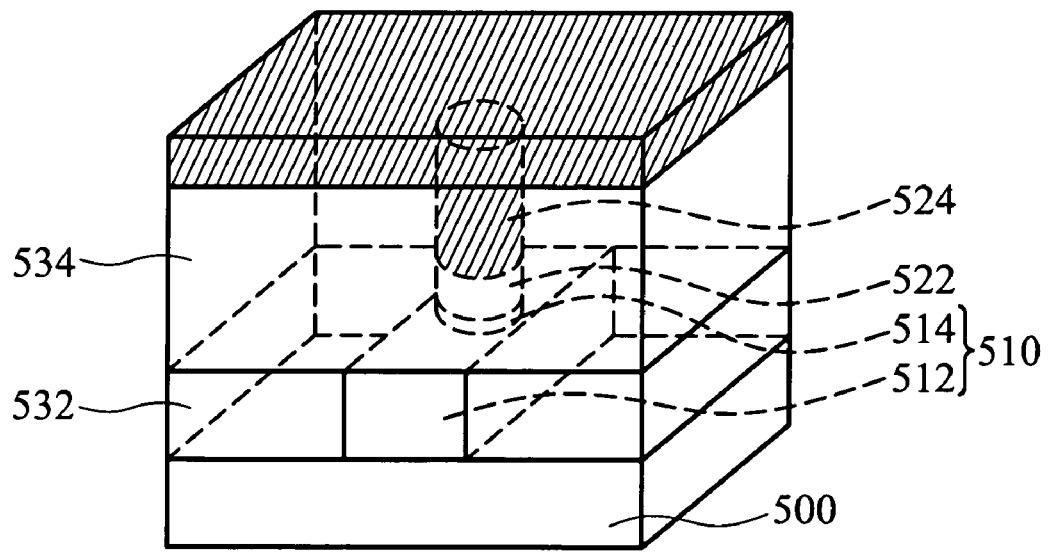

Referring to FIG. 5F, a silicon layer 524 is deposited on the second dielectric layer 534 filling the hole 523. The silicon layer 524 can be intrinsic or undoped silicon. Alternatively, the silicon layer 524 can be lightly second type doped, e.g., $n^-$-type doped, silicon. The $n^-$-type dopants comprise phosphorous (P) or arsenic (As).

The silicon layer 524 is then planarized with, for instance, chemical mechanical polishing (CMP) until the second dielectric layer 534 is exposed.

Figure 5G:
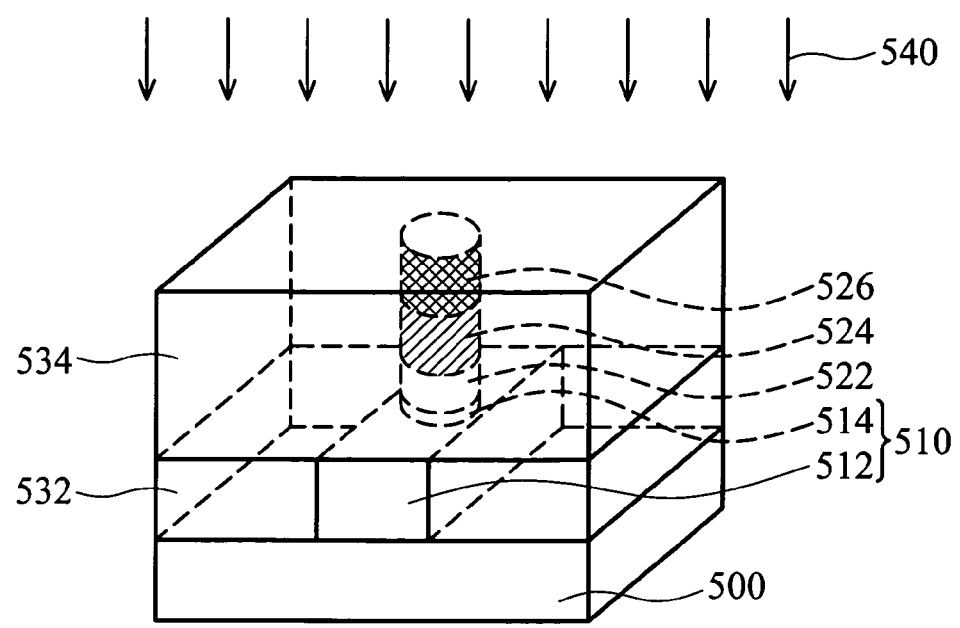

Referring to FIG. 5G, after CMP, the silicon layer 524 is subjected to an $n^+$-type ion implantation 540. Thus, an $n^+$-type doped silicon layer 526 is formed in the upper portion of the silicon layer 524. Dopant dosage of the $n^+$-type doped silicon layer 526 exceeds that of the lightly $n^-$-type doped silicon layer 524.

Figure 5H:
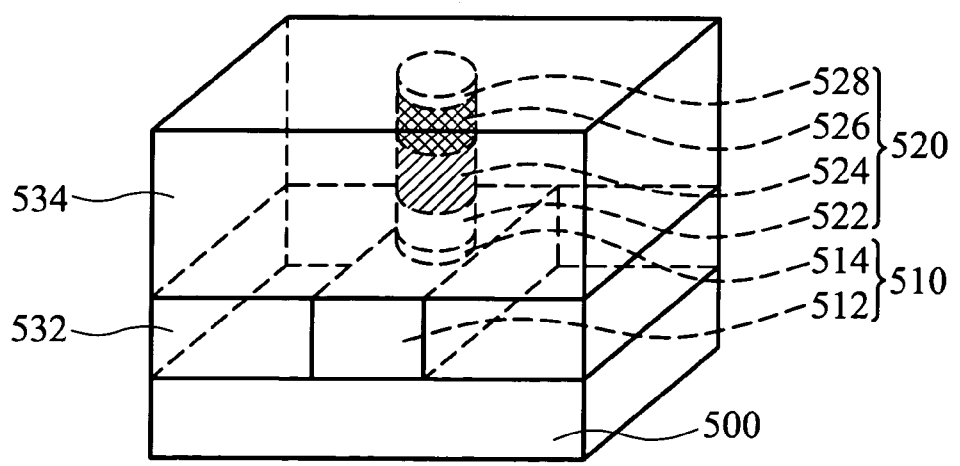

Referring to FIG. 5H, an insulating layer 528 comprising $SiO_2$, silicon nitride, or silicon oxynitride is subsequently formed on the n-type doped silicon layer 526 as an anti-fuse layer. Growth of the anti-fused layer 528 can be achieved by a number of methods, including rapid thermal oxidation (RTO), rapid thermal nitridation, PVD and CVD.

The pillar PN diode 520 formed in the hole 523 comprises a first diode component consisting of the $p^+$-type doped silicon layer 522, a second diode component consisting of the lightly $n^-$-type doped silicon layer 524, a buffer layer consisting of the $n^+$-type doped silicon layer 526, and the anti-fuse layer 528. In one preferred embodiment, the anti-fuse layer 528 is disposed on the $n^-$-type doped silicon layer 526.

Preferably, the thickness of the lightly $n^-$-type doped silicon layer 524 is about 2000~4000 Å, the thickness of the $n^+$-type doped silicon layer 526 is about 200~1000 Å and the thickness of the anti-fuse layer 528 is about 10~30 Å.

Figure 5I:
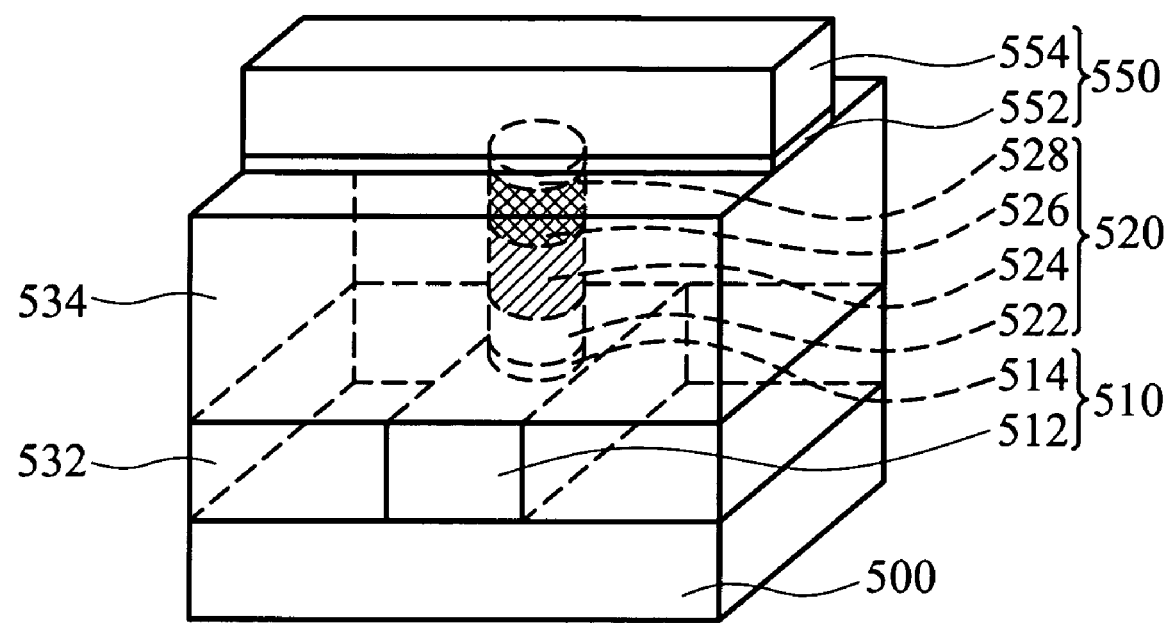

Referring to FIG. 5I, a second conductive line 550 comprising tungsten 554 or a barrier layer 552 beneath tungsten 554 is formed on the second dielectric layer 534 connecting the columnar PN diode 520.

The first conductive line 510 serving as a word line and the second conductive line 550 serving as a bit line are connected to a pillar PN diode serving as a switch. Alternatively, the first conductive line 510 serving as a bit line and the second conductive line 550 serving as a word line are connected to a pillar PN diode 520 serving as a switch. After programming by disrupting the anti-fuse layer 528, the switch is turned on allowing current to flow between the word line and bit line by passing through the PN diode.

Fifth Embodiment

FIGS. 6A through 6H are cross-sections of a one-time programmable memory cell according to a fifth embodiment of the present invention.

Figure 6A:
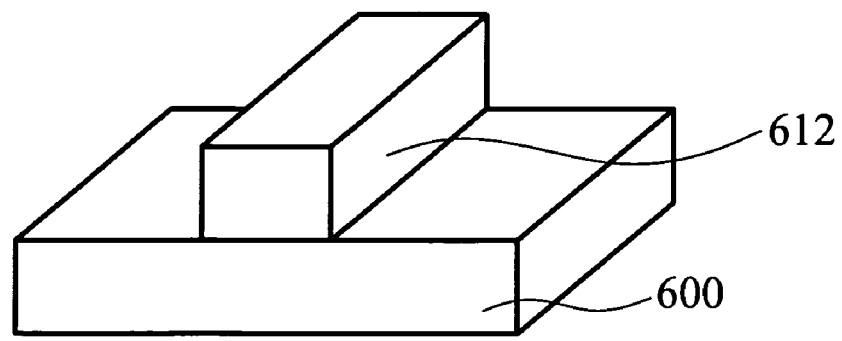
FIGS. 6A through 6H are cross-sections of a one-time programmable memory cell according to a fifth embodiment of the present invention.

Referring to FIG. 6A, first conductive line 612 comprising tungsten is provided on a single crystal silicon substrate 600 to serve as word line or bit line.

Figure 6B:
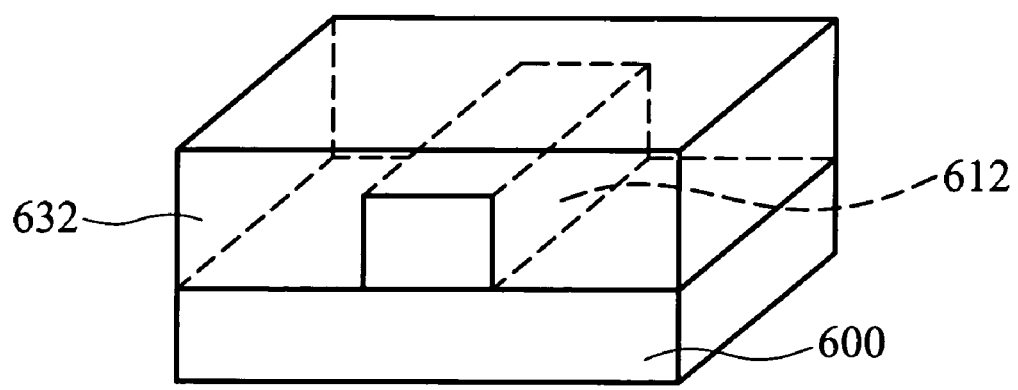
Figure 6C:
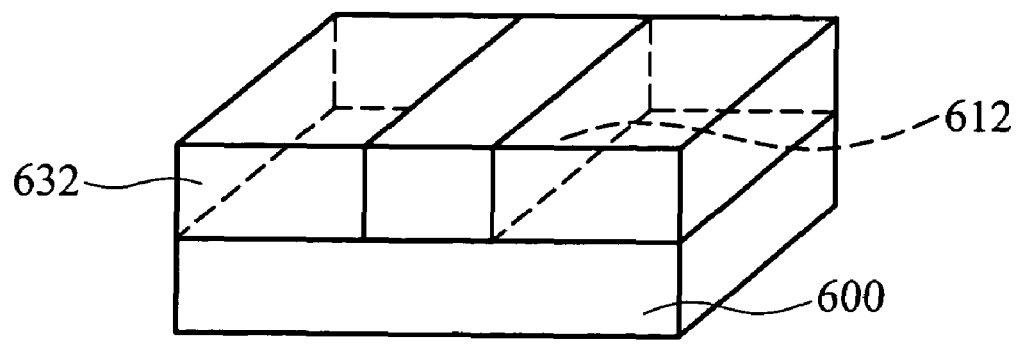

Referring to FIG. 6B, a first dielectric layer 632 is formed on the substrate 600 covering the first conductive line 612. The first dielectric layer 632 is planarized with, for instance, chemical mechanical polishing (CMP) to expose the first conductive line 612 and to provide a flat surface on which the array can be fabricated as shown in FIG. 6C.

Figure 6D:
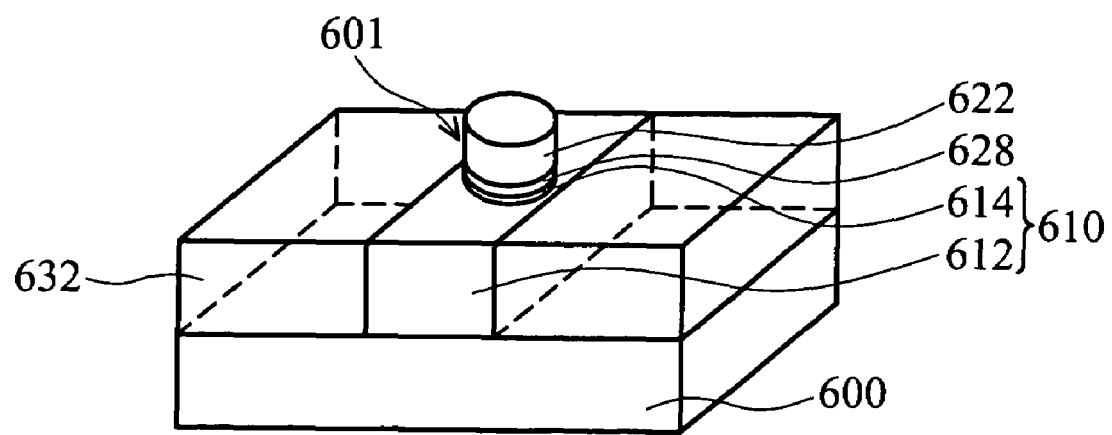

Referring to FIG. 6D, a stack of a barrier layer 614, an insulating layer 628, and a first type doped silicon layer 622 are formed on the first conductive line 612 preferably by selective deposition or patterning accompanying deposition. The barrier layer 614 and the first type doped silicon layer 622 are preferably formed on the flat surface of conductive line 612 and planarize dielectric 632 and lithographically etched into an island 601.

The insulating layer 628 comprising $SiO_2$, silicon nitride, or silicon oxynitride is served as an anti-fuse layer. Growth of the anti-fused layer 628 can be achieved by a number of methods, including PVD and CVD.

The first type, e.g., $p^+$-type, doped silicon layer 622 is formed preferably by deposition, such as chemical vapor deposition (CVD). In this embodiment, the formation of the $p^+$-type doped silicon layer 622 is accomplished by depositing a Si layer with $p^+$-type dopants. The $p^+$-type dopants comprise boron (B), Gallium (Ga) and indium (In).

Figure 6E:
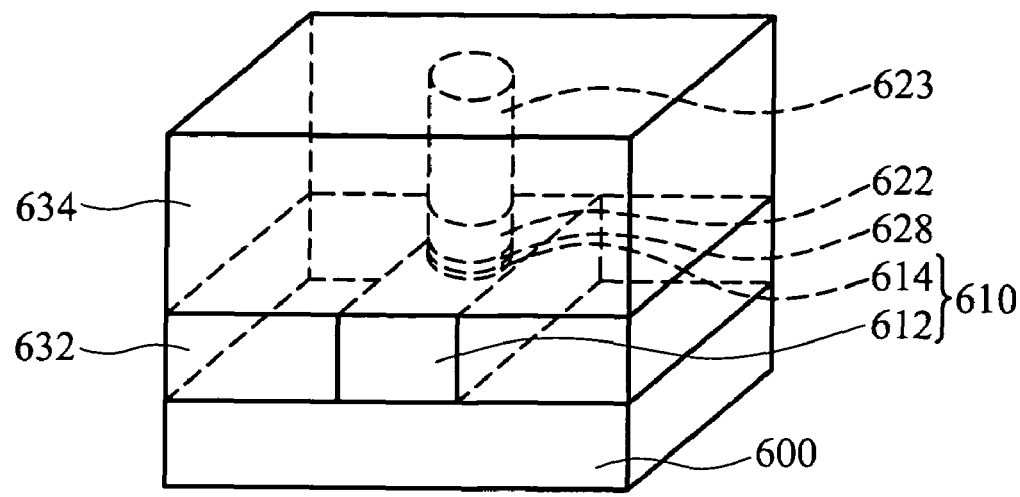

Referring to FIG. 6E, a second dielectric layer 634 is formed overlying the first dielectric 632 covering the stack of the $p^+$-type doped silicon layer 622, the anti-fused layer 628 and the barrier layer 614.

The second dielectric layer 634 is subsequently subjected to etching to form a hole 623 in the second dielectric layer 634 to expose the surface of the $p^+$-type doped silicon layer 622.

Figure 6F:
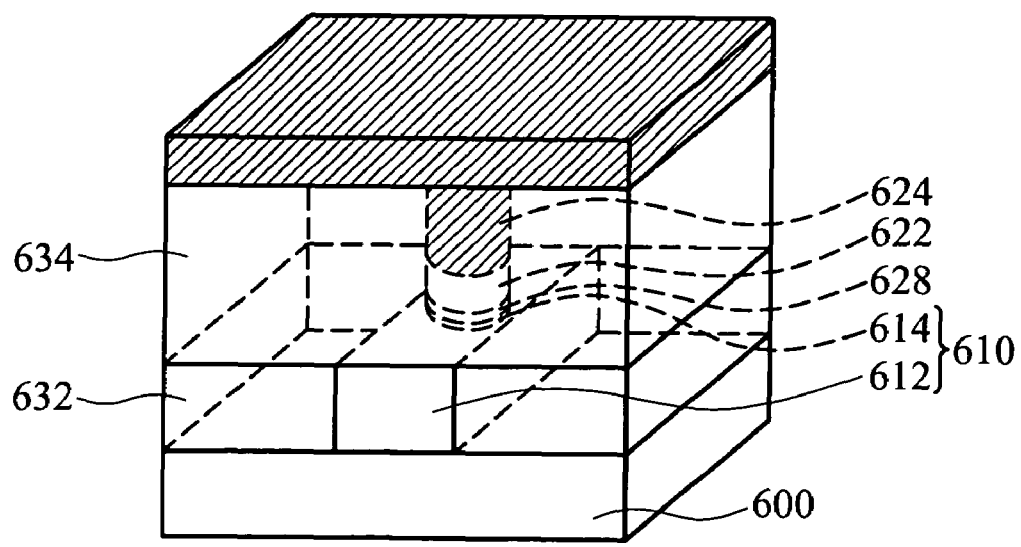

Referring to FIG. 6F, a silicon layer 624 is deposited on the second dielectric layer 634 filling the hole 623. The silicon layer 624 can be intrinsic or undoped silicon. Alternatively, the silicon layer 624 can be lightly second type doped, e.g., $n^-$-type doped, silicon. The $n^-$-type dopants comprise phosphorous (P) or arsenic (As).

The silicon layer 624 is then planarized with, for instance, chemical mechanical polishing (CMP) until the second dielectric layer 634 is exposed.

Figure 6G:
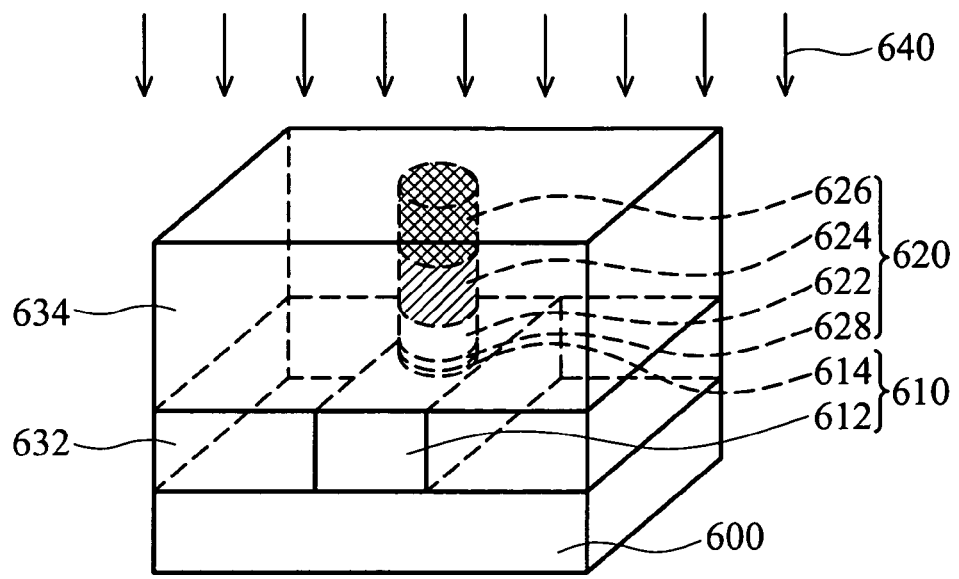
Figure 6H:
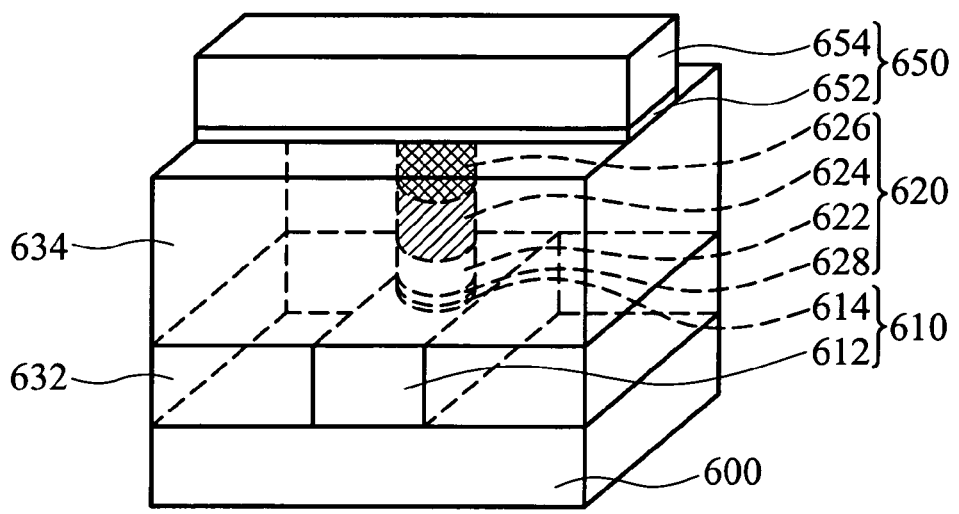

Referring to FIG. 6G, after CMP, the silicon layer 624 is subjected to an $n^+$-type ion implantation 640. Thus, an $n^+$-type doped silicon layer 626 is formed in the upper portion of the silicon layer 624. Dopant dosage of the $n^+$-type doped silicon layer 626 exceeds that of the lightly $n^-$-type doped silicon layer 624.

The pillar PN diode 620 formed in the hole 623 comprises the anti-fuse layer 628, a first diode component consisting of the $p^+$-type doped silicon layer 622, a second diode component consisting of the lightly $n^-$-type doped silicon layer 624, and the $n^+$-type doped silicon layer 626. In this embodiment, the anti-fuse layer 628 is disposed underneath the $p^+$-type doped silicon layer 622.

Referring to FIG. 5H, a second conductive line 650 comprising tungsten 654 or a barrier layer 652 beneath tungsten 654 is formed on the second dielectric layer 634 connecting the columnar PN diode 620.

Sixth Embodiment

FIGS. 7A through 7H are cross-sections of a one-time programmable memory cell according to a fourth embodiment of the present invention.

Figure 7A:
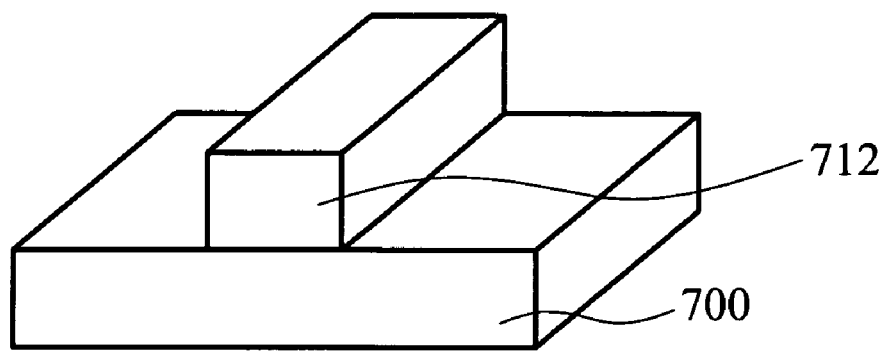
FIGS. 7A through 7H are cross-sections of a one-time programmable memory cell according to a sixth embodiment of the present invention.

Referring to FIG. 7A, first conductive line 712 comprising tungsten is provided on a single crystal silicon substrate 700 to serve as word line or bit line.

Figure 7B:
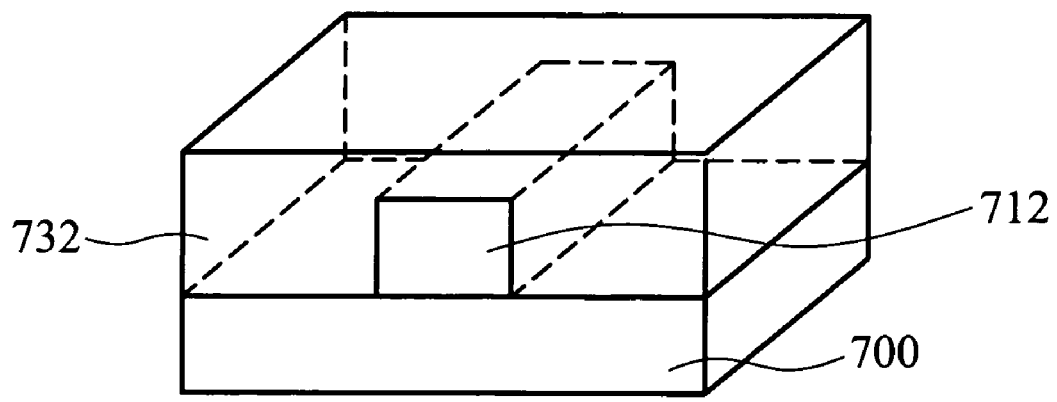
Figure 7C:
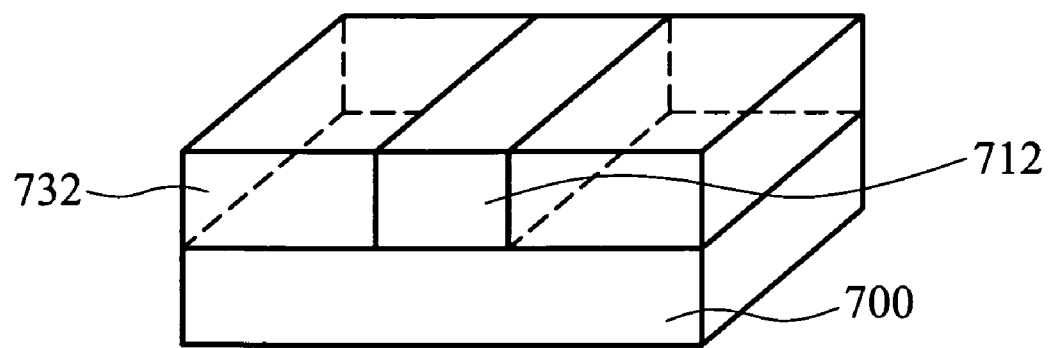

Referring to FIG. 7B, a first dielectric layer 732 is formed on the substrate 700 covering the first conductive line 712. The first dielectric layer 732 is planarized with, for instance, chemical mechanical polishing (CMP) to expose the first conductive line 712 and to provide a flat surface on which the array can be fabricated as shown in FIG. 7C.

Figure 7D:
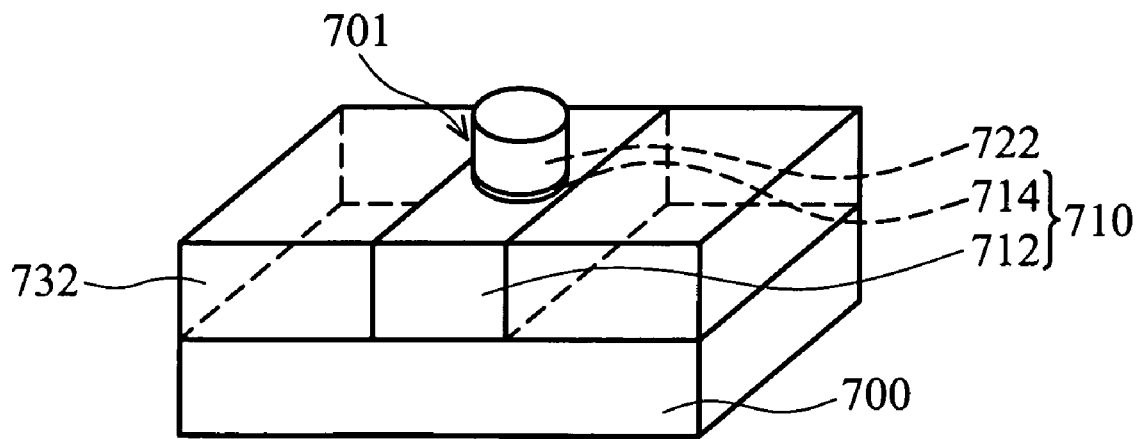

Referring to FIG. 7D, a stack of a barrier layer 714 and a first type doped silicon layer 722, 728 are formed on the first conductive line 712 preferably by selective deposition or patterning accompanying deposition. The barrier layer 714 and the first type doped silicon layer 722 are preferably formed on the substrate 700 and lithographically etched into an island 701.

A first type, e.g., $p^+$-type, doped silicon layer 722 is formed preferably by deposition, such as chemical vapor deposition (CVD). In the preferred embodiment, the formation of the $p^+$-type doped silicon layer 722 is accomplished by depositing a Si layer with $p^+$-type dopants. The $p^+$-type dopants comprise boron (B), Gallium (Ga) and indium (In).

Figure 7E:
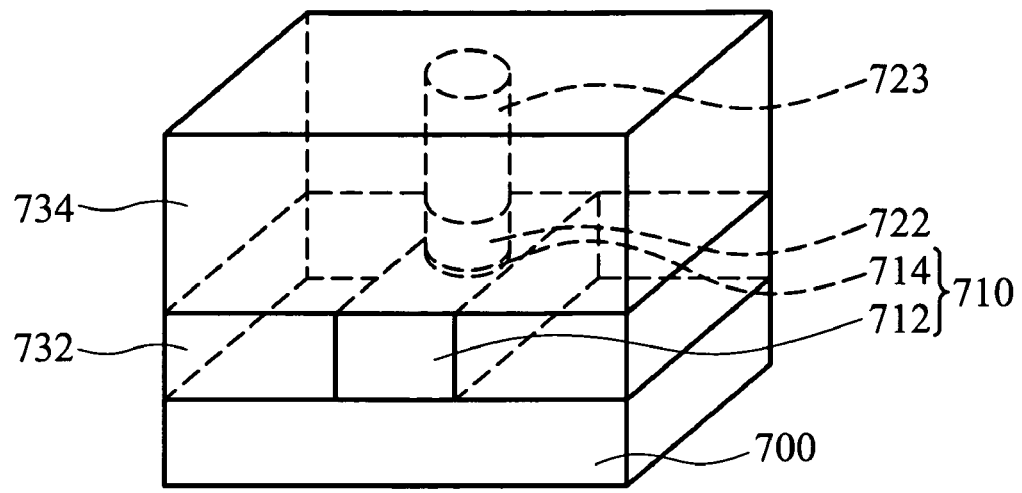

Referring to FIG. 7E, a second dielectric layer 734 is formed overlying the first dielectric 732 covering the $p^+$-type doped silicon layer 722 and the barrier layer 714.

The second dielectric layer 734 is subsequently subjected to etching to form a hole 723 in the second dielectric layer 734 to expose the surface of the $p^+$-type doped silicon layer 722.

Figure 7F:
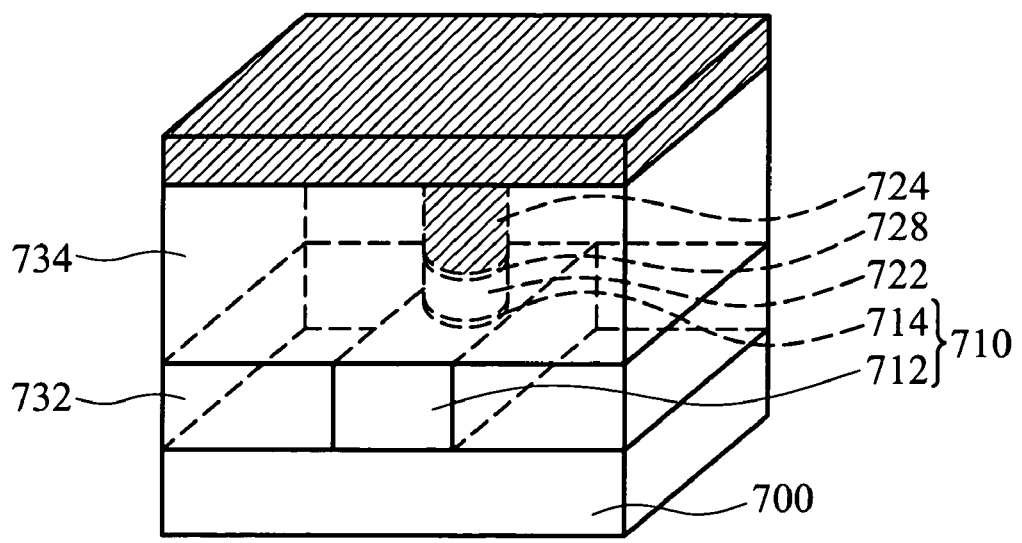

Referring to FIG. 7F, an insulating layer 728 comprising $SiO_2$, silicon nitride, or silicon oxynitride is subsequently formed in the hole 723 and on the $p^+$-type doped silicon layer 722 as an anti-fuse layer. Growth of the anti-fused layer 728 can be achieved by a number of methods, including rapid thermal oxidation (RTO), rapid thermal nitridation, PVD and CVD. A silicon layer 724 is deposited on the second dielectric layer 734 filling the hole 723. The silicon layer 724 can be intrinsic or undoped silicon. Alternatively, the silicon layer 724 can be lightly second type doped, e.g., $n^-$-type doped, silicon. The $n^-$-type dopants comprise phosphorous (P) or arsenic (As).

The silicon layer 724 is then planarized with, for instance, chemical mechanical polishing (CMP) until the second dielectric layer 734 is exposed.

Figure 7G:
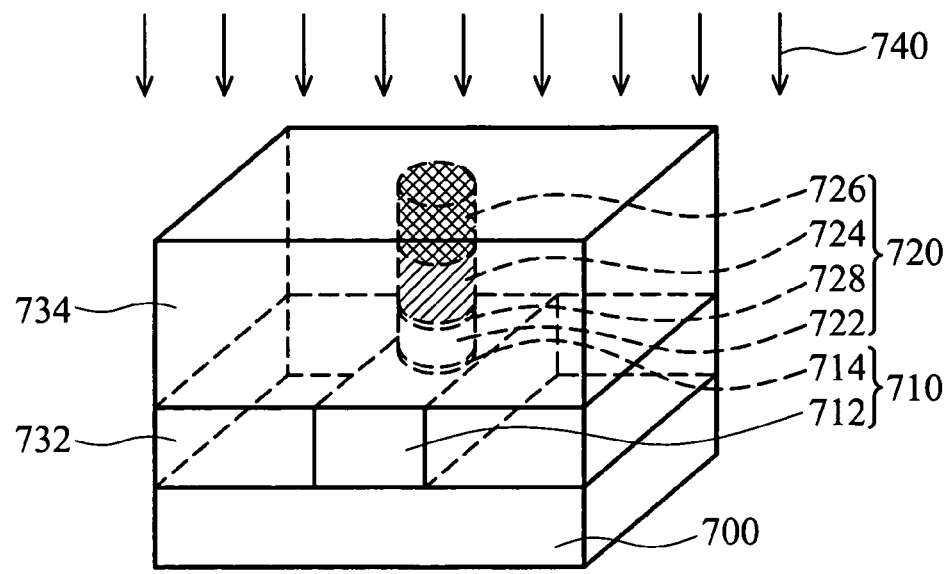

Referring to FIG. 7G, after CMP, the silicon layer 724 is subjected to an $n^+$-type ion implantation 740. Thus, an $n^+$-type doped silicon layer 726 is formed in the upper portion of the silicon layer 724. Dopant dosage of the $n^+$-type doped silicon layer 726 exceeds that of the lightly $n^-$-type doped silicon layer 724.

The pillar PN diode 720 formed in the hole 723 comprises a first diode component consisting of the $p^+$-type doped silicon layer 722, the anti-fuse layer 728, a second diode component consisting of the lightly $n^-$-type doped silicon layer 724, and the $n^+$-type doped silicon layer 726. In one preferred embodiment, the anti-fuse layer 728 is interposed between the first diode component 722 and the second diode component 724.

Figure 7H:
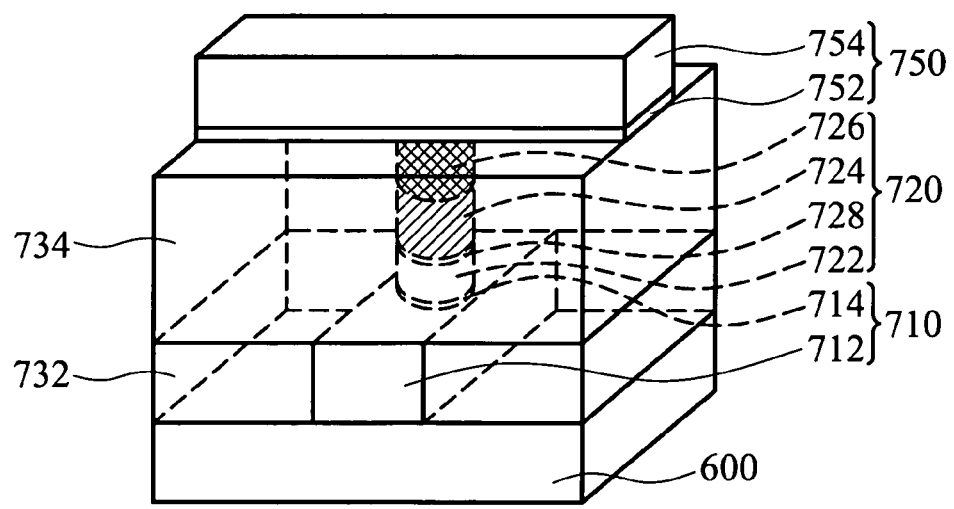

Referring to FIG. 7H, a second conductive line 750 comprising tungsten 754 or a barrier layer 752 beneath tungsten 754 is formed on the second dielectric layer 734 connecting the columnar PN diode 720.

The invention been thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A method for fabricating a memory cell, comprising:
   forming a first conductive line and a first diode component on a substrate sequentially;
   forming a dielectric layer on the substrate covering the first conductive line and the first diode component;
   etching the dielectric layer to create an opening exposing the first diode component;
   forming a stack filling the opening, comprising a second diode component, a buffer layer and an anti-fuse layer; and
   forming a second conductive line on the dielectric layer, connecting the stack and generally perpendicularly to the first conductive line,
   wherein the dielectric layer is formed before the stack of the second diode component, the buffer layer and the anti-fuse layer is filled, and
   wherein the stack is formed by the steps of:
      oxidizing a surface of the first diode component to create an oxide layer to act as the anti-fuse layer;
      filling the opening with silicon to form a silicon column contacting the anti-fuse layer; and
      performing an ion implantation to the silicon column to form a heavily doped upper portion of the silicon column as the buffer layer and a lightly doped lower portion of the silicon column as the second diode component.

2. The method according to claim 1, wherein the first and/or second conductive layer comprise a TiN barrier layer and a tungsten layer.

3. The method according to claim 1, wherein the first diode component comprises p-type doped silicon and the second diode component comprises n-type doped silicon.

4. The method according to claim 1, wherein the anti-fuse layer comprises an insulating layer formed on the buffer layer in contact with the second conductive line, or beneath the second diode component in contact with the first diode component.

5. A method for fabricating a memory cell, comprising:
   forming a first conductive line in a first dielectric layer on a substrate, exposing a surface of the first conductive line;
   forming a first column comprising a first diode component on the exposed first conductive layer;
   forming a second dielectric layer covering the first dielectric layer and the first conductive line and the first diode component;
   etching the second dielectric layer to create an opening exposing the first diode component;
   forming a second column filling the opening, comprising a second diode component, a buffer layer and an anti-fuse layer; and
   forming a second conductive line on the second dielectric layer, connecting the second column and generally perpendicularly to the first conductive line,
   wherein the second dielectric layer is formed before the second column of the second diode component, the buffer layer and the anti-fuse layer is filled, and
   wherein the second diode component and the buffer layer are formed by the steps of:
      oxidizing a surface of the first diode component to create an oxide layer to act as the anti-fuse layer;
      filling the opening with silicon to form a silicon column contacting the anti-fuse layer; and
      performing an ion implantation on the silicon column to form a heavily doped upper portion of the silicon column as the buffer layer and a lightly doped lower portion of the silicon column as the second diode component.

6. The method according to claim 5, wherein the first and/or second conductive line comprise a TiN barrier layer and a tungsten layer.

7. The method according to claim 5, wherein the first diode component comprises p-type doped silicon and the second diode component comprises n-type doped silicon.

8. The method according to claim 5, wherein the anti-fuse layer comprises an insulating layer formed on the buffer layer in contact with the second conductive line, or beneath the second diode component in contact with the first diode component.

* * * * *